United States Patent [19]

Abe et al.

[11] Patent Number: 5,194,364
[45] Date of Patent: Mar. 16, 1993

[54] PROCESS FOR FORMATION OF RESIST PATTERNS

[75] Inventors: Naomichi Abe, Tokyo; Takushi Motoyama, Kawasaki, both of Japan

[73] Assignee: Fujitsu Limited, Kanagawa, Japan

[21] Appl. No.: 746,071

[22] Filed: Aug. 8, 1991

Related U.S. Application Data

[63] Continuation of Ser. No. 323,710, Mar. 15, 1990, abandoned.

[30] Foreign Application Priority Data

Mar. 16, 1988 [JP]  Japan .................. 63-060218
Jan. 20, 1989 [JP]  Japan .................... 1-12445

[51] Int. Cl.$^5$ ............... G03C 5/00; G03C 5/16
[52] U.S. Cl. .................. 430/325; 430/286; 430/287; 430/197
[58] Field of Search ............... 430/287, 286, 325, 197

[56] References Cited

U.S. PATENT DOCUMENTS 4,368,092  1/1983  Steinberg et al. ............ 156/345
4,500,628  2/1983  Taylor ........................ 430/311

FOREIGN PATENT DOCUMENTS 0164598  12/1985  European Pat. Off. .
58-165321  9/1983  Japan .
63-15240  1/1988  Japan .

OTHER PUBLICATIONS

Patent Abstracts of Japan vol. 12, No. 139 (C-491) (2986) Apr. 27, 1988, & JP-A-62 256804 (NEC Corp.) Nov. 9, 1987.
Patent Abstracts of Japan vol. 12, No. 220 (P-720) (3067) Jun. 23, 1988, & JP-A-63 015240 (Fujitsu Ltd.) Jan. 22, 1988.
Patent Abstracts of Japan vol. 10, No. 50 (E-384) (2107) Feb. 27, 1986, & JP-A-60 206135 (Toshiba K.K.) Oct. 17, 1985.

Primary Examiner—Charles L. Bowers, Jr.
Assistant Examiner—Thorl Chea
Attorney, Agent, or Firm—Armstrong, Westerman, Hattori, McLeland & Naughton

[57] ABSTRACT

Process for the formation of resist patterns in a single layer resist process and a two layer resist process comprising using a resist material prepared from a silicon-containing polymer and an addition agent which can bond to said polymer upon an addition reaction when said resist material is exposed to a patterning radiation, and developing an exposed layer of said resist material with the down flow etching. The resulting resist patterns can be advantageously used in the production of LSIs, VLSIs and other devices.

25 Claims, 5 Drawing Sheets

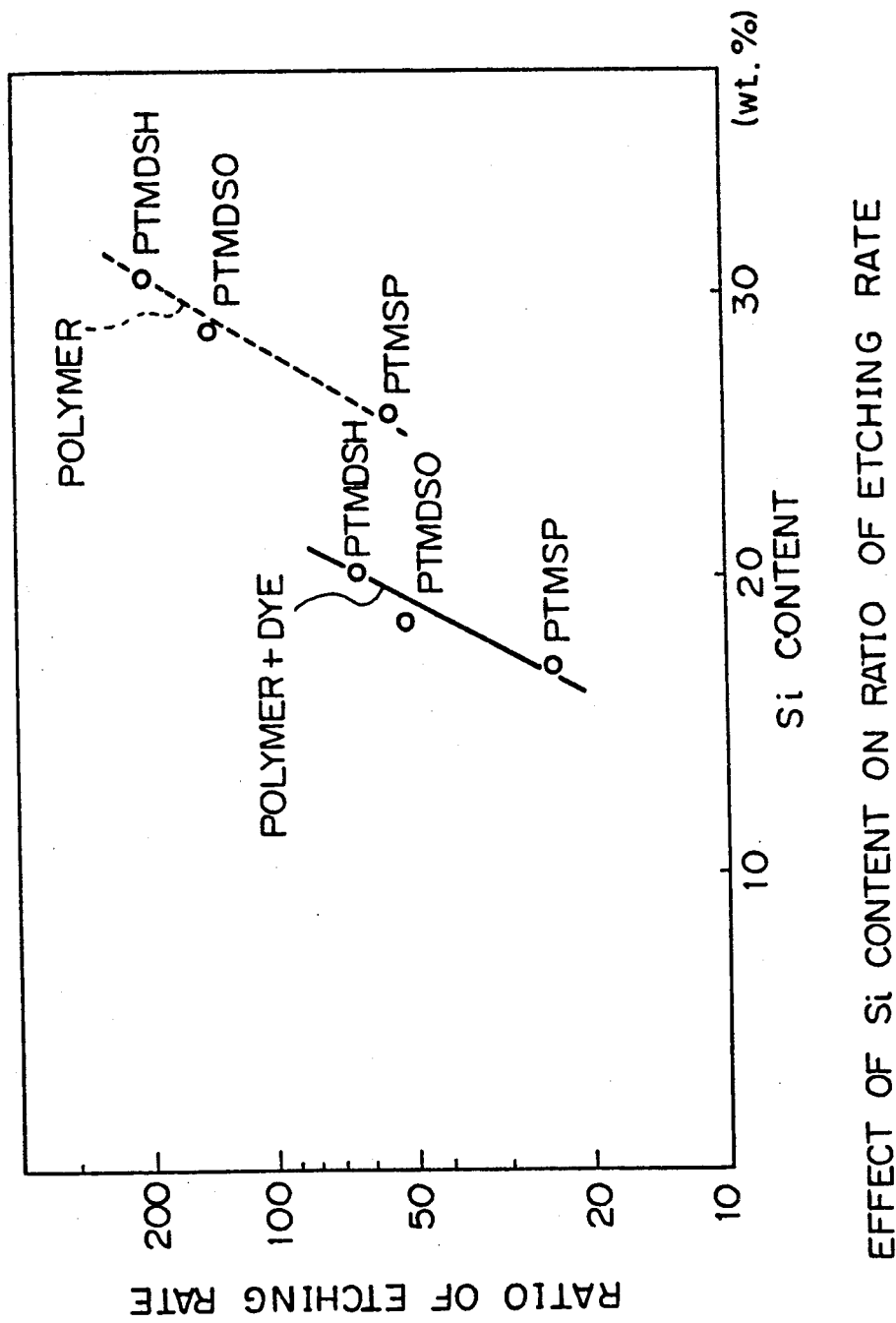

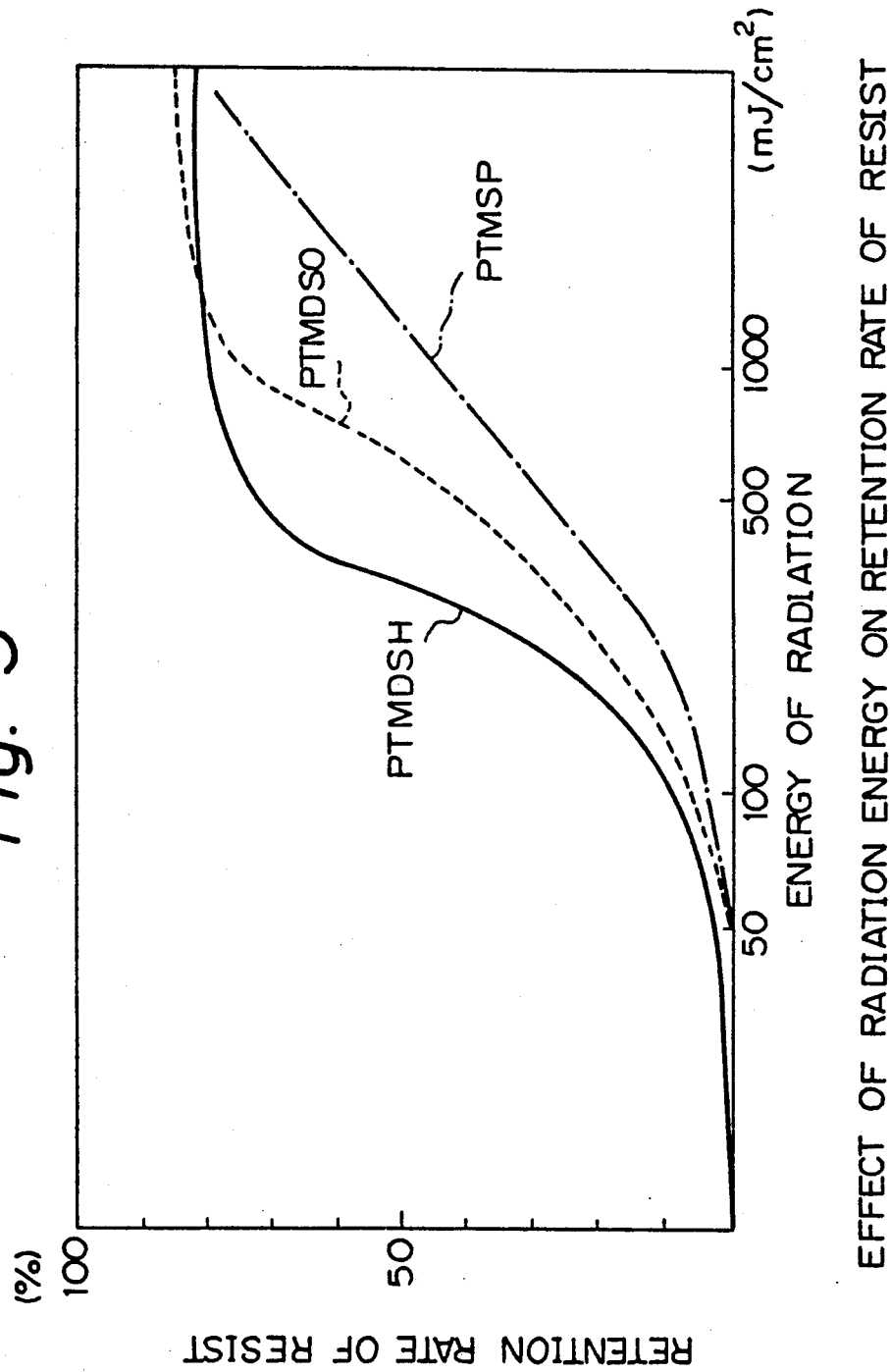

PROCESS FOR FORMATION OF RESIST PATTERNS

This application is a continuation of application Ser. No. 323,710 filed Mar. 15, 1990, now abandoned.

BACKGROUND OF THE INVENTION

1. Field of the Invention

The present invention relates to a process for the formation of resist patterns, particularly negative resist patterns. The pattern formation process of the present invention can be effectively used in both a single layer resist process and a two layer resist process currently used to obtain resist patterns having a high resolution and aspect ratio on a substrate having topographic features. The resulting resist patterns can be advantageously used in the production of semiconductor devices such as large-scale integrated (LSI) circuits, very-large-scale integrated (VLSI) circuits, and bubble memory devices, and the like.

2. Description of the Related Art

As is well-known, a thin layer formation technology and lithography are widely utilized in the production of LSI, VLSI, and the like, for example. An important process in this technology is a resist process used in the field of fine fabrication. Generally, the resist process is classified into a single layer resist process and a multilayer resist process, such as a two layer or three layer resist process. In these resist processes, a plurality of negative-working or positive-working resist materials are used depending upon the desired results and other factors.

For example, the single layer resist process using a negative-working resist material is conducted as follows: A solution of the selected resist material is coated on a substrate and then dried to form a resist layer. The resist layer is patterned by exposure to light or radiation to which the resist material is sensitive, for example, ultraviolet radiation. As a result of this exposure, the resist material in an exposed area of the resist layer is insolubilized in a developing solution such as organic solvents. The mechanism of insolubilization is based on, for example, cross-linking of the resist material. The exposed resist layer is developed with the developing solution to remove the unexposed resist material from the resist layer, and a negative resist pattern is thus formed on the substrate. This process has a drawback, however, in that a high quality resist pattern cannot be obtained, since the substrate is swollen as a result of contact thereof with the solvent used as the developer in the wet development step.

To remove the above drawback due to wet development, the inventor created an improved resist process as disclosed in Japanese Unexamined Patent Publication (Kokai) No. 63-15240, in which the resist process or patterning process comprises coating a resist material having a polymer having a double bond or triple bond in a backbone chain thereof, as a main component, on a substrate to form a layer of the resist material, exposing a selected area of the layer to ultraviolet radiation, X-rays or electron beams, and developing the exposed layer with the down flow etching method using an oxygen-containing gas. The polymer includes, for example, 1,4-polybutadiene, 1,4-polybutadiyne or derivatives thereof, and contains one or more benzene rings and chlorine atoms in a polymeric structure thereof. Further, the oxygen-containing gas used in the development step is, for example, a mixture of oxygen and carbon tetrafluoride. According to the process of Japanese Kokai 63-15240, since specific polymers containing unsaturated bonds as well as benzene rings and chlorine atoms are used as the resist material and the exposed resist material is developed with a dry process, high quality negative resist patterns can be obtained.

The substrate used in the production of the semiconductor devices and the like, as is well-known in the art, may comprise any material such as a semiconductor, for example, silicon (Si). The substrate may have any layer such as an insulating layer, for example, $SiO_2$ layer or a polysilicon layer on a surface thereof, and further, may contain topographic features, i.e., concaves and convexes, on a surface thereof. The topographic features are produced, for example, when an electrically insulating layer is coated over the surface of the circuit pattern-bearing substrate, and the topographic features have a height of about 1 to 2 $\mu$m.

When the substrate to be processed has topographic features, it is difficult to use the above-described single layer resist process to obtain resist patterns of a submicron order on the substrate, because the topographic features adversely affect the resulting resist patterns. Namely, due to a disordered reflection of exposure light or radiation such as electron beams at the concaves and convexes in the resist patterns, the formation of fine resist patterns at a high accuracy is impossible.

In place of the single layer resist process, a multilayer resist process, especially a two layer resist process has been used to obtain fine resist patterns of a submicron order on the topographic features-bearing substrate. The two layer resist process generally comprises coating an organic resist material such as phenol-novolac resin or cresol-novolac resin on the substrate to level the topographic features thereof. The resulting resist layer (hereinafter "lower resist layer") is relatively thick and has a thickness of about 2 to 3 $\mu$m, for example. After formation of the lower resist layer, a polymeric resist material having a high resistance to dry etching, such as chloromethylated polydiphenyl siloxane of the structure formula:

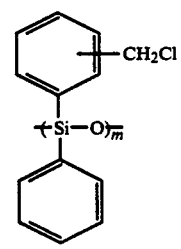

wherein m represents a polymerization degree ("SNR" commercially available from Tosoh Corporation) or a copolymer of trimethylsilylstyrene and chloromethyl styrene of the structural formula:

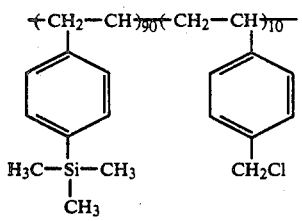

is coated on the lower resist layer. The resulting layer (hereinafter "upper resist layer") is remarkably thinner than the lower resist layer and generally has a thickness of about 0.2 to 0.5 μm. The reason why the silicon-containing polymers are suitable as the upper resist material is that these polymers also can form an $SiO_x$ layer having a high resistance to dry etching during the subsequent $O_2$-RIE (reactive ion etching) generally used to transfer a pattern of the upper resist layer to the lower resist layer.

After a two layer resist structure is produced, a pattern formation is conducted as follows: The upper resist layer is patterned by exposure to light or radiation, for example, by applying a projection exposure or contact exposure, through a mask, to the resist layer. When the resist layer is negative-working, an exposed area of the layer is insolubilized in a developing solution. The exposed upper resist layer is then developed with the developing solution to remove an unexposed area thereof, and a pattern of the upper resist layer is thus formed. Using this pattern as a mask, the underlying lower resist layer is dry etched with, for example, $O_2$-RIE, to transfer the pattern of the upper resist layer to the lower resist layer, and a desired negative resist pattern is finally obtained.

The above process can overcome the problems of the topographic features, but since it is based on a solution development system, the same problem as in the above-described single layer resist arises, i.e., swelling of the upper resist layer. To remove this swelling problem, it has been proposed to develop the upper resist layer under dry conditions. For example, Japanese Unexamined Patent Publication (Kokai) No. 58-165321 teaches dry plasma development of the silicon-containing upper resist layer using plasma containing a gas of halogen compounds.

More particularly, Example 1 of Japanese Kokai 58-165321 discloses spin-coating polyimide on a silicon wafer to form a lower resist layer having a thickness of 1 μm. The lower resist layer is then coated with a mixture (5:1) of polyglycidyl methacrylate and dimethyldiphenylsilane to form an upper resist layer having a thickness of 0.2 μm. The resulting resist structure is pattern-wise exposed to electron beams, and then developed using a plasma of oxygen gas and Freon ® gas. The unexposed area of the upper resist layer is thus removed. Next, the resist structure is dry etched. When the patterned upper resist layer containing Si is brought into contact with oxygen plasma during dry etching of the lower resist layer, $SiO_2$ is produced in the upper resist layer, which then becomes hard. As a result, a retention rate of the resist, i.e., ratio (%) of the thickness of the resist after development to that of the resist before development in the same area of the resist layer where the resist should be retained, can be improved.

Nevertheless, the prior art two layer resist process has a disadvantage in that a retention rate of the resist in the resulting resist patterns is not satisfactory because physical actions such as ion bombardment during the $O_2$-RIE adversely affect the improvement of such retention rate. Further, if the silicon-containing resist or polymer is prepared by introducing a silicon atom into the organic resist or polymer, an amount of the silicon in the resulting upper resist patterns is limited and, in practice, is not high enough to ensure a satisfactory resistance to the $O_2$-RIE of the upper resist layer during etching of the lower resist layer. It is, therefore, desired to provide an improved process for the resist pattern formation which ensures a formation of fine resist patterns of a submicron order at a high resolution and retention rate of the resist. It is also desired to confer a high resistance to dry etching such as the $O_2$-RIE to the resulting resist pattern.

SUMMARY OF THE INVENTION

According to the present invention, there is provided a process for the formation of resist patterns comprising preparing a resist material by mixing a silicon-containing polymer with an addition agent which can bond to the polymer upon an addition reaction when a mixture of the polymer upon an addition agent is exposed to radiation, coating the resist material on a substrate to form a resist layer, exposing the resist layer to a pattern of the radiation, and dry developing the exposed resist layer with an oxygen-containing etching gas in the absence of plasma of the gas in an etching chamber positioned apart form a plasma generation chamber to form the resist patterns on the substrate.

The silicon-containing polymer used as a main resist material in the present invention, as described hereinafter in detail, preferably contains at least one unsaturated bond such as a double bond and triple bond in a backbone chain of the recurring unit thereof, although the polymer containing only single bonds is also available.

Further, the addition agent used in combination with the silicon-containing polymer is preferably an olefin, azide, imide or derivatives thereof, and further preferably, contains at least one substituent selected from the group consisting of aromatic groups such as benzene ring and halogen atoms such as chlorine.

Developing of the exposed resist layer, as described above, is preferably carried out with dry etching by using an oxygen-containing etching gas as the active species in the absence of plasma of the gas in an etching chamber positioned apart from a plasma generation chamber. This development process is generally referred to as a down flow etching process and will be further described hereinafter.

According to the present invention, there is also provided a process for the formation of resist patterns comprising forming a two-layered resist structure on a substrate having topographic features on a surface thereof by coating on the surface, in sequence, a lower resist layer having a layer thickness enough to level the topographic features from an organic resist and an upper resist layer from a resist material prepared by mixing a silicon-containing polymer with an addition agent which can bond to the polymer upon an addition reaction when a mixture of the polymer and the addition agent is exposed to radiation, exposing the resist structure to a pattern of the radiation, dry developing the exposed resist structure with an oxygen-containing etching gas in the absence of plasma of the gas in an etching chamber positioned apart from a plasma generation chamber to form patterns of the upper resist layer on the lower resist layer, and further etching the lower resist layer, through the patterns of the upper resist layer as a mask, using a dry plasma etching method to etch an unmasked lower resist layer so that the patterns of the upper resist layer are transferred to the lower resist layer, to thereby form the resist patterns on the substrate.

BRIEF DESCRIPTION OF THE DRAWINGS

FIG. 4 is a graph showing the relationship between the Si content in the resist and ratio of the etching rate of said resist; and, FIG. 5 is a graph showing the relationship between the energy level of radiation irradiated on the resist layer and the retention rate of the resist.

DESCRIPTION OF THE PREFERRED EMBODIMENTS

Figure 1A:
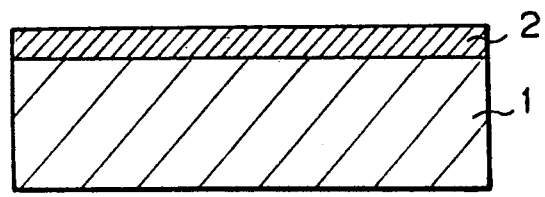
FIGS. 1A to 1C are cross-sectional views showing, in sequence, the pattern formation process according to a single layer resist process of the present invention.

In the practice of the present invention, a mixture of the silicon-containing polymer and the addition agent is used as the resist material. The silicon-containing polymer used may be optionally selected from a variety of well-known polymers which satisfy the requirements of the present process. The silicon-containing polymer preferably contains at least one unsaturated bond such as a double or triple bond. Typical examples of such useful silicon-containing polymers includes silylated polyacetylenes such as poly(1-methyl, 2-trimethylsilyl) acetylene, poly[1,2-bis(trimethylsilyl)]acetylene or the like and other silicon-containing polymers such as polymethylsilylmethacrylate, poly trimethylsilylmethacrylate, poly(3-pentamethyldisiloxane)methacrylate and the like, although the present invention is not restricted to these polymers.

In addition to the double bond-containing polymers, single bond-containing and triple bond-containing polymers are also available. An example of the single bond-containing polymers is

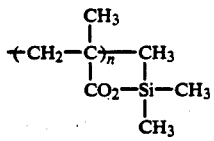

and an example of the triple bond-containing polymers is

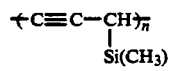

wherein n represents a polymerization degree.

The addition agent used in admixture with the silicon-containing polymer, as previously described, is preferably an olefin, azide, imide or derivatives thereof. Desirably, the addition agent contains at least one substituent such as aromatic groups, for example, benzene ring, or halogen atoms, for example, chlorine or bromine atoms.

Typical examples of useful addition agent include, for example, cinnamoyl chloride, diphenylacetylene, 2,3-diphenylbutadiene, benzyl cinnamate, 2-cinnamoylthiophene, 2,2-dimethoxy-2-phenylacetophenone, 4-azidebenzalcyclohexane, 1,4-diphenylpolybutadiene, 2,6-dichloroquinonechloroimide, 2,6-dibromoquinonechloroimide or chloranil. Other compounds may be used as the addition agent, insofar as they can bond to the polymer upon the addition reaction as a result of exposure to suitable radiation.

The silicon-containing polymer and addition agent may be blended in a wide range of mixing ratios, depending upon factors such as desired results and the like.

If a single resist layer is desired, the resist material can be coated from a solution thereof onto a surface of the substrate such as a silicon substrate or wafer. Spin coating is preferably used. In addition, if appropriate, vacuum deposition or other coating methods may be used to form the resist layer.

Alternatively, if a two layer layer resist structure is desired, the above-described resist layer is used as an upper resist layer and is coated after the underlying resist layer "lower resist layer" has been coated on the substrate. The resist material for the lower resist layer is optional and can be selected from the well-known resist materials such as phenol resins, polyimide resins, polystyrene resins, epoxy resins, novolac resins, and the like.

The single resist layer or upper resist layer is then exposed to a desired pattern of light or radiation which can cause an addition reaction of the polymer and addition agent in the layer. Useful exposure sources include light such as visible light as well as radiation such as ultraviolet radiation, deep ultraviolet radiation, X-rays, electron beams and ion beams.

After patterning exposure, the resist layer is developed with the down flow etching method. Namely, the resist layer is dry developed with an oxygen-containing etching gas as an active species in the absence of plasma of said gas in an etching chamber positioned apart from a plasma generation chamber. The etching gas is downwardly introduced into said etching chamber, while the plasma of gas is retained in the plasma generation chamber. The etching gas is preferably produced from a mixture of oxygen ($O_2$) gas and carbon tetrafluoride ($CF_4$) gas. The resist material in an unexposed area of the resist layer is removed by this development.

The mechanism of the formation of the resist patterns described above is explained as follows:

If a mixed resist of the silicon-containing polymer (for example, polyacetylene with a silyl group) and the addition agent (for example, olefin) as the resist layer is exposed to a pattern of light or radiation, the following reaction occurs in an exposed area of the resist layer.

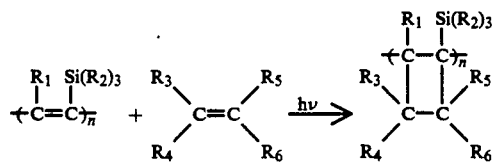

wherein $R_1$, $R_2$, $R_3$, $R_4$, $R_5$ and $R_6$ may be the same or different and each represents a hydrogen atom or a substituted or unsubstituted alkyl or aryl group, and n represents a polymerization degree. In the olefin of the above formula, if one or more of $R_3$, $R_4$, $R_5$ and $R_6$ are substituted by, for example, a phenyl group or a halogen atom (see, below), a resistance of the exposed resist to dry etching will be further increased.

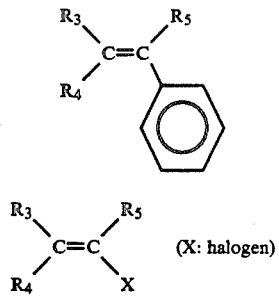

(X: halogen)

After exposure, the resist layer is developed with the down flow etching method using an oxygen-containing gas (for example, a mixed gas of $O_2/CF_4$). Etching of the resist is predominantly made in an exposed area of the resist layer, and as a result, a negative resist pattern corresponding to the pattern of the exposure light or radiation is formed. Although this process has not been analyzed in depth, it is considered that, if plasma of $O_2/CF_4$ gas is generated upon application of a microwave, active species are simultaneously generated and then guided to the etching chamber where the active species are chemically reacted with the resist, and the reacted resist is etched off.

The negative resist pattern thus obtained can be used as a mask in the production of semiconductor devices or other devices. Further, if the resist layer is an upper resist layer of the two layer resist structure, the negative resist pattern can be used as a mask for etching in transferring a pattern of the upper resist layer to the lower resist layer. Etching in such instances can be advantageously carried out by using a dry plasma etching method such as $O_2$-RIE or ECR (electron cyclotron resonance) etching, although development of the lower resist layer according to the present invention is not restricted to these two methods.

In connection with the two layer resist process described above, the inventor further found that undesirable shifting of the resulting patterns in the two layer resist process can be effectively prevented if a mixture of high silicon polymer such as polyacetylene having an unsaturated bond in a backbone chain of the recurring unit thereof and at least two silicon atoms on a side chain thereof and addition agent such as ultraviolet absorbing agent is used as the resist material. Useful high silicon polymers include, for example, poly 4,4,6,6-tetramethyl-4,6-disila-2-heptyne (PTMDSH) and poly 4,4,7,7-tetramethyl-4,7-disila-2-octyne (PTMDSO):

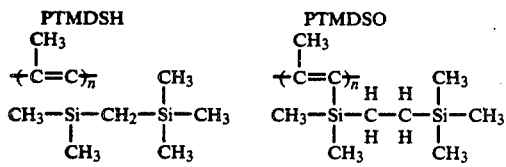

wherein n represents a polymerization degree.

Of course, in addition to these polymers, the polymers containing only one silicon atom on a side chain tereof such as poly 1-(trimethylsilyl)propyne (PTMSP) of the following structural formula:

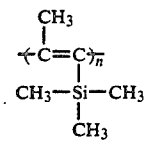

wherein n represents a polymerization degree, can provide good results.

The above two layer resist process, according to a preferred embodiment of the present invention, comprises the steps of:

forming a lower resist layer of the organic resist on a substrate to be processed to level topographic features of the substrate; further forming an upper resist layer of the above-described high silicon polymer and ultraviolet absorbing agent over the lower resist layer; patterning the upper resist layer by exposure to ultraviolet radiation; heating the substrate under a reduced pressure to remove the unreacted ultraviolet absorbing agent from the upper resist layer; developing the exposed upper resist layer with the down flow etching method using a $O_2/CF_4$ gas to obtain a pattern of the upper resist layer; and, etching the lower resist layer, through a mask of the patterned upper resist layer, with anisotropic plasma etching.

According to the process of the present invention, since the exposed silicon-containing resist layer (and the upper resist layer in the two layer resist process) is dry developed without using a developer solution, it is possible to easily produce fine resist patterns of a submicron order. As appreciated from the above description, this is because swelling of the resist layer is avoided due to the absence of the developer solution. Further, since the dry development is carried out in accordance with the down flow etching process, namely, development is not conducted in an atmosphere of $O_2$ plasma as in a conventional prior art dry development process, but is based on chemical reactions free from ion bombardment, the retention rate of the resist can be remarkably improved. Furthermore, since the silicon-containing polymer, which silicon content can be easily adjusted to a high level, is used as the resist material, if the high silicon polymer is used as the upper resist layer in the two layer resist process, a satisfactorily increased resistance to $O_2$-RIE can be attained during RIE etching of the lower resist layer. In addition to these advantages, according to the process of the present invention, since pattern shifting of the resist during RIE etching of the lower resist layer is eliminated or reduced to negligible proportions, the production yield of the devices, and the characteristics thereof, are improved.

The present invention will be further described with reference to the following examples to which the present invention is not restricted. cl EXAMPLE 1

This is an example of the single layer resist process of the present invention and is described with reference to FIGS. 1A to 1C and FIG. 3.

A mixture (2:1) of poly(1-methyl, 2-trimethylsilyl-)acetylene as the silicon-containing polymer and cinnamoyl chloride as the addition agent was dissolved in xylene to prepare a ca. 1% by weight resist solution, and the resist solution was spin-coated on the substrate. The substrate used herein was a silicon substrate or wafer having cleaned surfaces. After drying, as illustrated in FIG. 1A, a resist layer 2 having a layer thickness of about 400 nm was formed on an upper surface of the substrate 1.

Figure 1B:
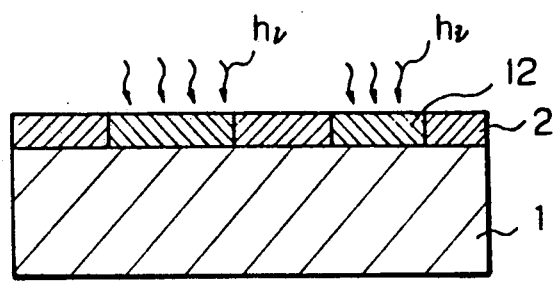

Then, as illustrated in FIG. 1B, the resist layer 2 was patterning exposed through a mask (not shown) to radiation from an Xe-Hg lamp for about 30 seconds. The contact exposure method was used and an illuminance on a surface of the wafer during exposure was about 5 mW/cm$^2$. An exposed area 12 of the resist layer 2 showed an increased resistance to dry etching in the next development step.

Figure 3:
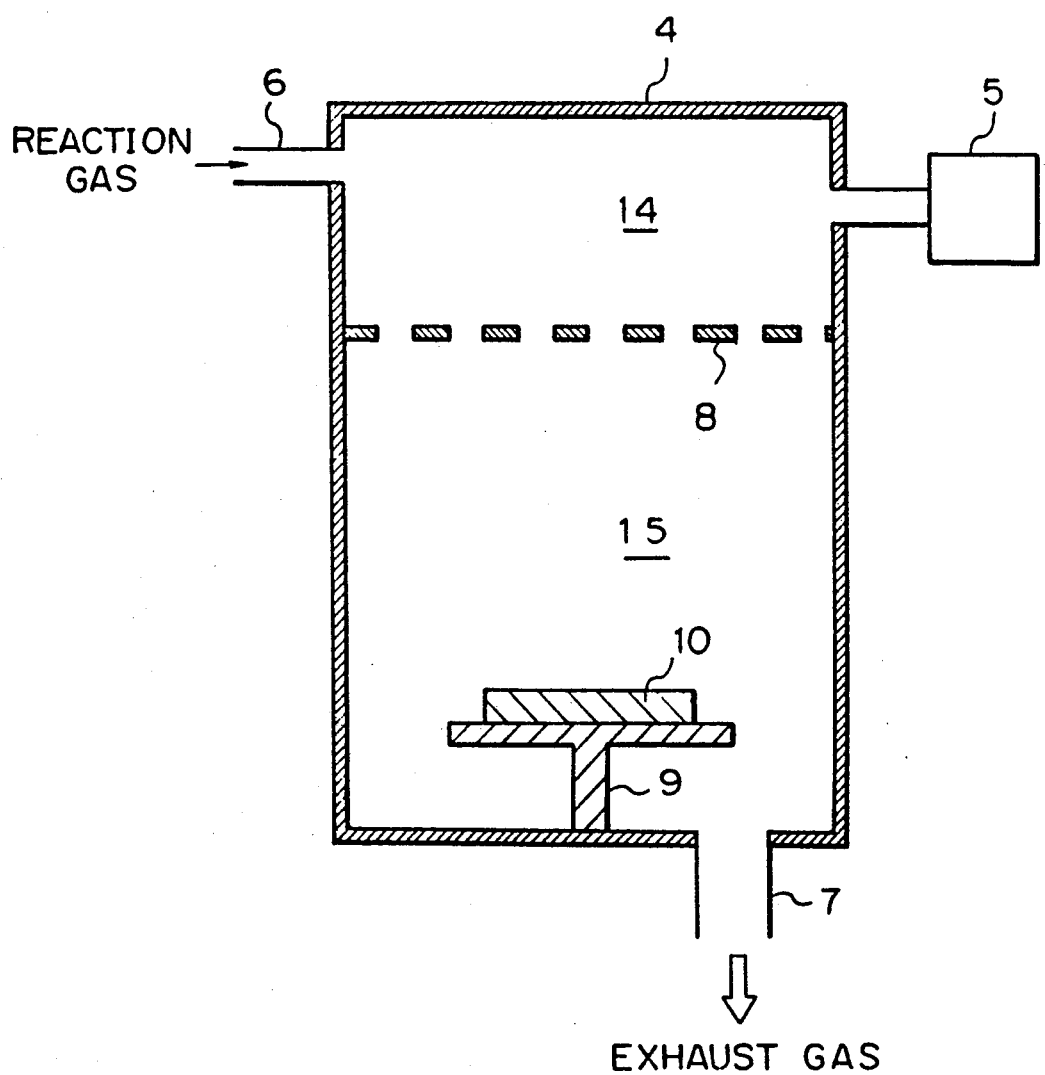
FIG. 3 is a cross-sectional view showing the down flow etching apparatus used in the pattern formation process of the present invention.

Development of the exposed resist layer was made in a developing apparatus of FIG. 3. The wafer 10 was placed in an etching chamber 15 of the developing apparatus 4 and carried with a wafer holder 9. A mixed gas of $O_2CF_4$ as a reaction gas was introduced from a gas inlet 6 into a plasma generator 14 of the apparatus 4, and exhausted from a gas outlet 7 of the same apparatus 4. During development, a microwave (not shown) from a magnetron 5 was guided into the plasma generation chamber 14, and applied to the downwardly flowing reaction gas to generate plasma of the reaction gas. The plasma itself was stopped with a shield plate 8 for the microwave, but radicals of the atoms constituting the reaction gas (neutral active species) generated together with the gas plasma entered the etching chamber through openings of the shield plate 8. The exposed resist layer (not shown) of the wafer 10 was thus developed with the downwardly flowing plasma-free etching gas. The conditions used in this development step were as follows:

| Flow rate of $O_2$: | 1000 SCCM, |
|---|---|
| Flow rate of $CF_4$: | 500 SCCM, |
| Pressure: | 6 Torr, |
| Power of microwave: | 750 W. |

Power of microwave: 750 W.

Figure 1C:
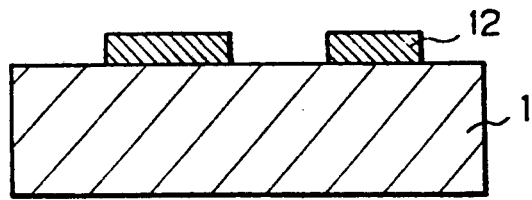

As a result of this development, a negative pattern 12 of the resist layer was formed on the substrate (see FIG. 1C). It was observed that the resist pattern had a retention rate of the resist of about 90% and a resolution of about 0.5 μm l/s (line & space).

Further, the procedure of this example was repeated, except that the mixed gas of $O_2/CF_4$ was replaced by a mixed gas of $O_2/CF_6$ and a mixed gas of $O_2/NF_3$. In each instance, similar results were obtained.

EXAMPLE 2

This is an example of the two layer resist process of the present invention and is described with reference to FIGS. 2A to 2E.

Figure 2A:
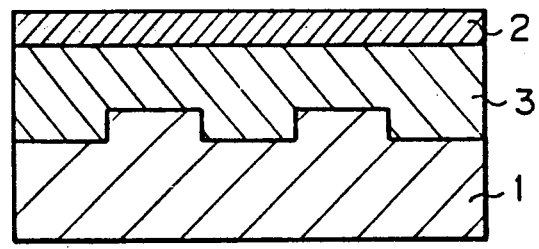
FIGS. 2A to 2E are cross-sectional views showing, in sequence, the pattern formation process according to a two layer resist process of the present invention.

FIG. 2A illustrates a cross-section of the two layer resist structure used in this example. The substrate 1 was a silicon wafer and, as illustrated, contained topographic features. The resist structure was prepared as follows.

The novolac resist: OFPR-800, products of Tokyo Oka Laboratories Limited was spin-coated on an upper surface of the silicon wafer 1 to level the unevennesses of the wafer surface, and a lower resist layer 3 having a layer thickness of about 2 μm was thus formed on the silicon wafer 1. Thereafter, the same resist material as used in Example 1 was spin-coated on the lower resist layer 2 in accordance with the procedure of Example 1, and an upper resist layer 2 having a thickness of about 400 nm was produced.

Figure 2B:
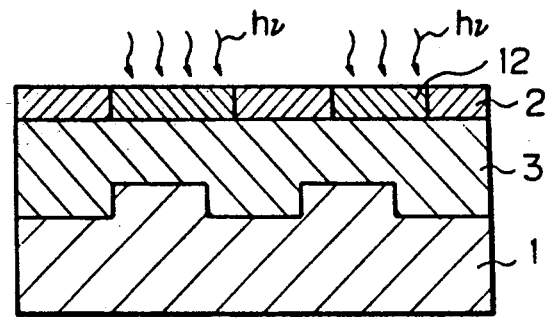

After preparation of the resist structure, the upper resist layer 2 was patterning exposed as in Example 1 and as shown in FIG. 2B. An exposed area 12 of the resist layer 2 on the lower resist layer 3 showed an increased resistance to dry etching.

Figure 2C:
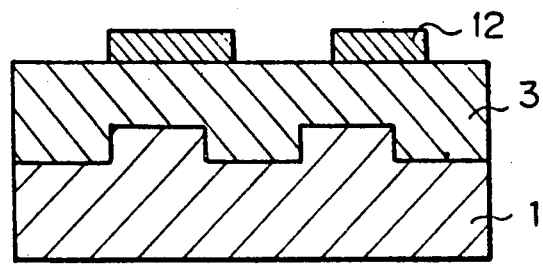

The exposed upper resist layer 2 was then developed as in the development step of Example 1, and as shown in FIG. 2C, a negative pattern 12 of the resist layer was formed as a result of this development.

Figure 2D:
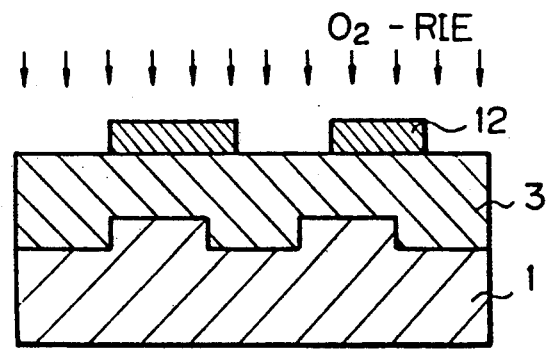

After the resist pattern 12 was formed, using this pattern as a mask, the underlying lower resist layer 3 was dry etched with $O_2$-RIE to transfer the pattern 12 to the layer 3 (see FIG. 2D). The conditions for this reactive dry etching using $O_2$ gas were as follows:

| Flow rate of $O_2$: | 100 SCCM, |
|---|---|
| Pressure: | 0.03 Torr, |
| Output: | 500 W. |

Figure 2E:
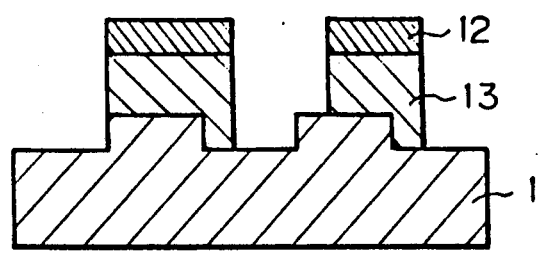

The unmasked area of the lower resist layer 13 was selectively etched as a result of this etching, and as shown in FIG. 2E, a negative pattern of the resist 12 plus 13 was eventually formed on the topographic features-bearing substrate 1. It was observed that the resist pattern had a thickness of 2 μm and a resolution of 0.5 μm l/s.

EXAMPLE 3

The procedure of Example 1 was repeated, except that polytrimethylsilylmethacrylate was used as the silicon-containing polymer and diphenylacetylene as the addition agent, respectively, and finally, a negative pattern of the resist layer was formed on the substrate. It was observed that the resist pattern had a retention rate of the resist of 60%, a resolution of 1 μm, and a sensitivity of 300 mJ.

EXAMPLE 4

The procedure of Example 1 was repeated, except that poly[1,2-bis(trimethylsilyl)]acetylene] was used in place of poly(1-methyl, 2-trimethylsilyl)acetylene, and a negative resist pattern having a retention rate of the resist of 90%, a resolution of 0.5 μm, and a sensitivity of 120 mJ was formed.

EXAMPLE 5

The procedure of Example 1 was repeated, except that poly(3-pentamethyldicyclohexane)methacrylate was used in place of poly(1-methyl, 2-trimethylsilyl-)acetylene, and a negative resist pattern having a retention rate of the resist of 70%, a resolution of 0.8 μm, and a sensitivity of 200 mJ was formed.

EXAMPLE 6

A mixture (3:2) of poly(1-methyl, 2-trimethylsilyl-)acetylene as the silicon-containing polymer and 2.,3-diphenylbutadiene as the addition agent was dissolved in xylene to prepare a ca. 1% by weight resist solution. The formation of a resist layer (thickness of about 300 nm), and the exposure and development were performed as in Example 1, and as a result, a negative resist pattern having a retention rate of the resist of 80%, a resolution of 0.5 μm, and a sensitivity of 150 mJ was obtained.

EXAMPLE 7

The same procedure as in Example 6 was repeated, except that diphenylacetylene was used in place of 2,3-diphenylbutadiene, and a negative resist pattern having a retention rate of the resist of 95%, a resolution of 2 $\mu$m, and a sensitivity of 230 mJ was obtained.

EXAMPLE 8

The same procedure as in Example 6 was repeated, except that benzyl cinnamate was used in place of 2,3-diphenylbutadiene, and a negative resist pattern having a retention rate of the resist of 75%, a resolution of 0.6 $\mu$m, and a sensitivity of 120 mJ was obtained.

EXAMPLE 9

The same procedure as in Example 6 was repeated, except that 2-cinnamoylthiophene was used in place of 2,3-diphenylbutadiene, and a negative resist pattern having a retention rate of the resist of 85%, a resolution of 0.5 $\mu$m, and a sensitivity of 200 mJ was obtained.

EXAMPLE 10

The same procedure as in Example 6 was repeated, except that 2,2-dimethoxy-2-phenylacetophenone was used in place of 2,3-diphenylbutadiene, and a negative resist pattern having a retention rate of the resist of 60%, a resolution of 1.0 $\mu$m, and a sensitivity of 100 mJ was obtained.

EXAMPLE 11

The same procedure as in Example 6 was repeated, except that 4-azidobenzalcyclohexanone was used in place of 2,3-diphenylbutadiene, and a negative resist pattern having a retention rate of the resist of 75%, a resolution of 0.7 $\mu$m, and a sensitivity of 70 mJ was obtained.

EXAMPLE 12

The same procedure as in Example 6 was repeated, except that 1,4-diphenylpolybutadiene was used in place of 2,3-diphenylbutadiene, and a negative resist pattern having a retention rate of the resist of 80%, a resolution of 1.5 $\mu$m, and a sensitivity of 200 mJ was obtained.

EXAMPLE 13

A mixture (3:2) of poly trimethylsilyl methacrylate and diphenylacetylene was dissolved in methyl cellosolve acetate to prepare a ca. 8% by weight resist solution. A silicon wafer was spin-coated with this solution, followed by drying to form a resist layer (thickness of about 300 nm). The resist layer was subjected to contact exposure for about 30 seconds by using an Xe-Hg lamp and then baked at about 70° C. in vacuum. Development of the exposed resist layer was then carried out under conditions of an $O_2$ flow rate of 1500 SCCM, a $CF_4$ flow rate of 300 SCCM, 3 Torr and 750 W on the down flow developing apparatus as in Example 1. As a result, a negative resist pattern having a retention rate of the resist of 50%, a resolution of 1.5 $\mu$m, and a sensitivity of 200 mJ was obtained.

EXAMPLE 14

The same procedure as in Example 13 was repeated, except that 2,3-diphenylbutadiene was used in place of diphenylacetylene, and a negative resist pattern having a retention rate of the resist of 60%, a resolution of 0.7 $\mu$m, and a sensitivity of 200 mJ was obtained.

EXAMPLE 15

The same procedure as in Example 13 was repeated, except that 4-azidobenzalcyclohexanone was used in place of diphenylacetylene, and a negative resist pattern having a retention rate of the resist of 65%, a resolution of 0.6 $\mu$m, and a sensitivity of 80 mJ was obtained.

EXAMPLE 16

This example followed the same procedures as performed in Example 2.

As shown in FIG. 2A, a wafer 1 was coated with a lower layer resist OFPR-800, and the resulting lower resist layer (thickness of about 2 $\mu$m) 3 was then coated with the resist of Example 6 as an upper resist layer 2. The upper resist layer 2 was exposed as in Example 6 (FIG. 2B), developed as in Example 6 (FIG. 2C), and then the lower resist layer 3 was etched, using the thus obtained negative upper pattern 12 as a mask, by $O_2$-RIE ($O_2$ of 50 SCCM, 0.02 Torr and 500 W) (FIG. 2D). As a result, a negative pattern 13 having a thickness of about 2 $\mu$m and having a resolution of 0.5 $\mu$m was obtained wherein a dimensional shift from the upper layer resist pattern 12 was 0.1 $\mu$m or less (FIG. 2E).

When the negative patterns prepared in Examples 7 to 15 were used as the mask during $O_2$-RIE, similar results were obtained.

EXAMPLE 17

This example followed the same procedures performed as in Example 2.

As shown in FIG. 2A, a wafer 1 was coated with a lower layer resist OFPR-800, and the resulting lower resist layer (thickness of about 2 $\mu$m) 3 was then coated with the resist of Example 6 as an upper resist layer 2. The upper resist layer 2 was exposed as in Example 6 (FIG. 2B), developed as in Example 6 (FIG. 2C), and then the lower resist layer 3 was etched, using the thus obtained negative upper pattern 12 as a mask, by electron cyclone resonance (ECR) etching ($O_2$ of 10 SCCM, $5 \times 10^{-4}$ Torr and 800 W) in place of $O_2$-RIE (FIG. 2D). As a result, a negative pattern 13 having a thickness of about 2 $\mu$m being a resolution of 0.5 $\mu$m, was obtained wherein a dimensional shift from the upper layer resist pattern 12 being 0.05 $\mu$m or less (FIG. 2E).

In the case that each of the negative patterns prepared in Examples 7 to 15 were used as the mask during ECR etching, similar results were obtained.

EXAMPLE 18

A mixture (3:2) of poly(1-methyl, 2-trimethylsilyl-)acetylene as the silicon-containing polymer and 2,6-dichloroquinonchloroimide as the addition agent was mixed to prepare a resist material, and a wafer was spin-coated with the thus prepared resist material to form a resist layer having a thickness of about 300 nm. The resist layer was then subjected to contact exposure by using of an Xe-Hg lamp and baked at about 70° C. in vacuum. Development of the exposed resist layer was then carried out under the conditions of a $O_2$ flow rate of 1000 SCCM, a $CF_4$ flow rate of 500 SCCM, 6 Torr and 750 W, on the down flow developing apparatus as in Example 1, and as a result, a negative resist pattern having a retention rate of the resist of 90%, a resolution of 0.5 $\mu$m, and a sensitivity of 100 mJ was obtained.

EXAMPLE 19

The same procedure as in Example 18 was repeated, except that 2,6-dibromoquinonchloroimide was used as the addition reaction initiator, and a negative resist pattern having a retention rate of the resist of 75%, a resolution of 0.7 μm, and a sensitivity of 200 mJ was obtained.

EXAMPLE 20

The same procedure as in Example 18 was repeated, except that poly[1,2-bis(trimethylsilyl)acetylene was used as the silicon-containing polymer, and a negative resist pattern having a retention rate of the resist of 85%, a resolution of 0.5 μm, and a sensitivity of 100 mJ was obtained.

EXAMPLE 21

The same procedure as in Example 20 was repeated, except that chloranil was used in place of 2,6-dichloroquinonchloroimide, and a negative resist pattern having a retention rate of the resist of 90%, a resolution of 0.6 μm, and a sensitivity of 150 mJ was obtained.

EXAMPLE 22

The same procedure as in Example 18 was repeated, except that polytrimethylsilyl methacrylate was used as the silicon-containing polymer and the development conditions for the down flow development were changed to an $O_2$ of 1500 SCCM, a $CF_4$ of 300 SCCM, 3 Torr and 750 W. A negative resist pattern having a retention rate of the resist of 60%, a resolution of 0.6 μm, and a sensitivity of 100 mJ was obtained.

EXAMPLE 23

The same procedure as in Example 22 was repeated, except that chloranil was used in place of 2,6-dichloroquinonchloroimide, and a negative resist pattern having a retention rate of the resist of 70%, a resolution of 0.7 μm, and a sensitivity of 120 mJ was obtained.

EXAMPLE 24

This example followed the procedures as performed in Example 2.

As shown in FIG. 2A, a wafer 1 was coated with a lower layer resist OFPR-800, and the resulting lower resist layer (thickness of about 2 μm) 3 was then coated with the resist of Example 18 as an upper resist layer 2. The upper resist layer 2 was exposed as in Example 2 (FIG. 2B), developed as in Example 2 (FIG. 2C), and then the lower resist layer 3 was etched, using the thus obtained upper negative pattern 12 as a mask, by $O_2$-RIE ($O_2$ of 50 SCCM, 0.02 Torr and 500 W) (FIG. 2D). As a result, a negative pattern having a thickness of about 2 μm and having a resolution of 0.5 μm was obtained wherein a dimensional shift from the upper layer resist pattern 12 was 0.1 μm or less (FIG. 2E).

When the negative patterns prepared in Examples 19 to 23 were used as the mask during $O_2$-RIE, similar results were obtained.

EXAMPLE 25

This example followed the procedures as performed in Example 2.

As shown in FIG. 2A, a wafer 1 was coated with a lower layer resist OFPR-800, and the resulting lower resist layer (thickness of about 2 μm) 3 was then coated with the resist of Example 18 as an upper resist layer 2. The upper resist layer 2 was exposed as in Example 2 (FIG. 2B), developed as in Example 2 (FIG. 2C), and then the lower resist layer 3 was etched, using the thus obtained negative upper pattern 12 as a mask, by electron cyclone resonance (ECR) etching ($O_2$ of 10 SCCM, $5 \times 10^{-4}$ Torr and 800 W) in place of $O_2$-RIE (FIG. 2D). As a result, a negative pattern 13 having a thickness of about 2 μm and having a resolution of 0.5 μm was obtained wherein a dimensional shift from the upper layer resist pattern 12 was 0.05 μm or less (FIG. 2E).

When the negative patterns prepared in Examples 19 to 23 were used as the mask during ECR etching, similar results were obtained.

EXAMPLE 26

This is an example of the two layer resist process of the present invention.

The novolac resist: OFPR-800 was spin-coated on an upper surface of the silicon wafer to form a lower resist layer having a thickness of 1.5 μm, the resist layer was then baked at 200° C., and after baking, a mixture (2:1) of poly 4,4,6,6-tetramethyl-4,6-disila-2-heptyne (PTMDSH) and 2,6-dichloroquinone-4-chloroimide (DCQI) was dissolved in xylene and the resulting resist solution was spin-coated on the lower resist layer previous formed, whereby an upper resist layer having a thickness of 0.45 μm was produced.

After preparation of the two layer resist structure, the upper resist layer was subjected to patterning contact exposure by using of a high pressure Xe-Hg lamp as an exposure source. The exposed upper resist layer was then heated at 50° C. for 5 minutes under a reduced pressure of 0.05 Torr to remove unreacted DCQI therefrom as a result of vaporization of the same.

Thereafter, the silicon wafer was placed in a dry etching apparatus. Using this apparatus, the down flow etching was performed as follows: Into a plasma generation chamber wherein the $O_2$ flow rate of 1000 cc/min, $CF_4$ flow rate of 500 cc/min and reduced pressure of 6 Torr were maintained, a microwave of output 700 W was introduced to generate a plasma of the mixed gas of $O_2$ and $CF_4$. The plasma was then introduced into an etching chamber through a plasma shield plate of metal mesh. Only radicals of the mixed gas were downwardly flown within the etching chamber, and the wafer placed in the etching chamber was place in contact with said radicals, and the upper resist layer thereof was selectively etched in conformity with the pattern of the exposure radiation. A negative pattern of the upper resist layer was obtained on the lower resist layer of the resist structure.

Subsequent to the patterning of the upper resist layer, using this patterned layer as a mask, the underlying lower resist layer was dry etched with $O_2$-RIE. The RIE conditions were: an $O_2$ flow rate of 20 cc/min, a vacuum of 0.08 Torr, and an RF power of 500 W. A pattern of the upper resist layer was exactly transferred to the underlying lower resist layer, no pattern shift was observed.

A ratio of etching rate of the lower layer resist to the upper layer resist was then determined. The results of determination demonstrated that the ratio of the etching rate in this example was 68 times, while the ratio in another two layer resist structure using poly 1-(trimethylsilyl)propyne (PTMSP) was about 20 times.

EXAMPLE 27

The procedure of Example 26 was repeated, except that PTMDSH was replaced with poly 4,4,7,7-tetramethyl-4,7-disila-2-octyne (PTMDSO). A pattern of the upper resist layer was exactly transferred to the underlying lower resist layer, and no pattern shift was observed. Further, it was determined that the ratio of the etching rate in this example was 52 times.

The results of the determination of the ratio of the etching rate in these examples are plotted in FIG. 4, together with the results for poly 1-(trimethylsilyl)-propyne (PTMSP) used in place of PTMDSH in Example 26. The graph of FIG. 4 clearly shows that the ratio of the etching rate is improved with an increase of the Si content in the silicon-containing polymer as the upper resist layer.

EXAMPLE 28

The procedures of Examples 26 and 27 were repeated to ascertain an effect of the energy of the radiation used in patterning on the retention rate of the resist after exposure, except that a KrF excimer laser (wavelength of 248 nm) was used as the patterning radiation.

The results plotted in FIG. 5 clearly show that PTMDSH and PTMDSO have an excellent sensitivity, although the sensitivity of PTMSP is also acceptable.

We claim:

1. A process for the formation of resist patterns consisting of essentially of preparing a resist material by mixing a silicon-containing polymer, which contains at least one unsaturated bond in a backbone chain of the recurring unit thereof as the main resist material, with an addition agent which can bond to said polymer by an addition reaction when a mixture of said polymer and said addition agent is exposed to radiation, coating said resist material on a substrate to form a resist layer, exposing said resist layer to a pattern of said radiation, and dry developing said exposed resist layer with an oxygen-containing etching gas in the absence of plasma of said gas in an etching chamber positioned apart from a plasma generation chamber to form said resist patterns on said substrate.

2. A process according to claim 1 wherein said polymer is polyacetylene.

3. A process according to claim 1 wherein said silicon-containing polymer is silylated polyacetylene.

4. A process according to claim 1 wherein said addition agent is an olefin, azide, imide, or derivatives thereof.

5. A process according to claim 1 or claim 4 wherein said addition agent contains at least one substituent selected from the group consisting of aromatic groups and halogen atoms.

6. A process according to claim 1 wherein said resist material is coated from a solution thereof on said substrate.

7. A process according to claim 1 wherein said radiation used in the exposure step induces an addition reaction of said addition agent onto said polymer, and is one of light, ultraviolet radiation, deep ultraviolet radiation, X-rays, electron beams, and ion beams.

8. A process according to claim 1 wherein said oxygen-containing etching gas used in dry development step is downwardly introduced into said etching chamber from said plasma generation chamber, while said plasma of said gas is retained in said plasma generation chamber.

9. A process according to claim 8 wherein said oxygen-containing etching gas is produced from a mixture of oxygen gas and carbon tetrafluoride gas in said plasma generation chamber.

10. A process according to claim 1 wherein said resist patterns are negative resist patterns and are used as a mask when said substrate is patterned by etching in the producing of semiconductor devices.

11. A process for the formation of resist patterns consisting essentially of forming a two-layered resist structure on a substrate having topographic features on a surface thereof by coating on said surface, in sequence, a lower resist layer having a layer thickness sufficient to level said topographic features from a organic resist and an upper resist layer from a resist material prepared by mixing a silicon-containing polymer, which contains at least one unsaturated bond in a backbone chain of the recurring unit thereof as the main resist material, with an addition agent which can bond to said polymer by an addition reaction when a mixture of said polymer and said addition agent is exposed to radiation; exposing said resist structure to a pattern of said radiation; dry developing said exposed resist structure with an oxygen-containing etching gas in the absence of plasma of said gas in an etching chamber to form patterns of said upper resist layer on said lower resist layer, and further etching said lower resist layer, through said patterns of said upper resist layer as a mask, using a dry plasma etching method to etch an unmasked lower resist layer so that said patterns of said upper resist layer are transferred to said lower resist layer, thereby forming said resist patterns on said substrate.

12. A process according to claim 11 wherein the polymer is polyacetylene.

13. A process according to claim 11 wherein said silicon-containing polymer is silylated polyacetylene.

14. A process according to claim 11 wherein said addition agent is an olefin, azide, imide, or derivatives thereof.

15. A process according to claim 11 or claim 14 wherein said addition agent contains at least one substituent selected from the group consisting of aromatic groups and halogen atoms.

16. A process according to claim 11 wherein said resist material forming said upper resist layer is coated from a solution thereof on said lower resist layer.

17. A process according to claim 11 wherein said radiation used in the exposure step can induce an addition reaction of said addition agent onto said polymer, and is light, ultraviolet radiation, deep ultraviolet radiation, X-rays, electron beams or ion beams.

18. A process according to claim 11 wherein said oxygen-containing etching gas used in the dry development step is downwardly introduced into said etching chamber from said plasma generation chamber, while said plasma of said gas is retained in said plasma generation chamber.

19. A process according to claim 18 wherein said oxygen-containing etching gas is produced from a mixture of oxygen gas and carbon tetrafluoride gas in said plasma generation chamber.

20. A process according to claim 11 wherein said dry plasma etching method is $O_2$-reactive ion etching.

21. A process according to claim 11 wherein said dry plasma etching method is an electron cyclotron resonance etching.

22. A process according to claim 11 wherein said polymer is polyacetylene having an unsaturated bond in a backbone chain of the recurring unit thereof and at least two silicon atoms on a side chain thereof, and said addition agent is an ultraviolet absorbing agent.

23. A process according to claim 22 wherein after exposure of said resist structure to a pattern of ultraviolet radiation and before development of said exposed resist structure, said exposed resist structure is heated under a reduced pressure to remove an unreacted ultraviolet absorbing agent therefrom.

24. A process according to claim 22 wherein said silicon-containing polyacetylene is poly 4,4,6,6-tetramethyl-4,6-disila-2-heptyne or poly 4,4,7,7-tetramethyl-4,7-disila-2-octyne.

25. A process according to claim 11 wherein said resist patterns are negative resist patterns and are used as a mask when said substrate is patterned by etching in the production of semiconductor devices.

* * * * *